United States Patent
Fujita et al.

(10) Patent No.: US 8,877,871 B2
(45) Date of Patent: Nov. 4, 2014

(54) ORGANIC SWITCHING ELEMENT AND METHOD FOR PRODUCING THE SAME

(75) Inventors: Katsuhiko Fujita, Fukuoka (JP); Kei Yasui, Funabashi (JP); Masaaki Ozawa, Funabashi (JP); Keisuke Odoi, Tokyo (JP); Hisashi Ichikawa, Fukuoka (JP)

(73) Assignees: Kyushu University, Fukuoka (JP); Nissan Chemical Industries, Ltd., Tokyo (JP)

( * ) Notice: Subject to any disclaimer, the term of this patent is extended or adjusted under 35 U.S.C. 154(b) by 1133 days.

(21) Appl. No.: 12/676,067

(22) PCT Filed: Sep. 1, 2008

(86) PCT No.: PCT/JP2008/065699
§ 371 (c)(1),
(2), (4) Date: Jun. 21, 2010

(87) PCT Pub. No.: WO2009/031507
PCT Pub. Date: Mar. 12, 2009

(65) Prior Publication Data
US 2010/0289012 A1 Nov. 18, 2010

(30) Foreign Application Priority Data
Sep. 3, 2007 (JP) ................. 2007-228332

(51) Int. Cl.
| | |
|---|---|
| C08F 2/46 | (2006.01) |
| C08F 12/08 | (2006.01) |
| C08F 12/30 | (2006.01) |
| G11C 13/00 | (2006.01) |
| C08F 220/38 | (2006.01) |
| H01L 51/00 | (2006.01) |
| H01L 51/05 | (2006.01) |

(52) U.S. Cl.
CPC .......... *H01L 51/004* (2013.01); *G11C 13/0014* (2013.01); *C08F 220/38* (2013.01); *G11C 13/0016* (2013.01); *H01L 51/0591* (2013.01)
USPC ............. 525/328.4; 525/328.2; 522/173; 526/346; 526/228

(58) Field of Classification Search
USPC .................. 522/173; 427/256; 526/346, 288; 525/328.2, 328.4
See application file for complete search history.

(56) References Cited

U.S. PATENT DOCUMENTS

| | | | | |
|---|---|---|---|---|
| 2006/0180809 A1* | 8/2006 | Park et al. | ........................ | 257/40 |
| 2008/0139692 A1* | 6/2008 | Ishizu et al. | .................. | 522/173 |
| 2010/0144957 A1* | 6/2010 | Yasui | ............................ | 524/547 |

FOREIGN PATENT DOCUMENTS

| | | |
|---|---|---|
| JP | A-2004-513513 | 4/2004 |
| JP | A-2004-200569 | 7/2004 |
| JP | A-2005-101594 | 4/2005 |
| JP | A-2006-245549 | 9/2006 |
| WO | WO 2006/093050 * | 8/2006 |
| WO | WO 2008/117772 * | 3/2008 |

OTHER PUBLICATIONS

Zhao et al., Dithiocarnamate Assembly on Gold, JACS communications, Published May 3, 2005, pp. 1-2.*
Ouyang et al., "Organic Memory Device Fabricated Through Solution Processing," Proceeding of the IEEE, Jul. 2005, pp. 1287-1296, vol. 93, No. 7.
International Search Report issued in International Application No. PCT/JP2008/065699 mailed on Sep. 22, 2008.

* cited by examiner

*Primary Examiner* — James J Seidleck
*Assistant Examiner* — Deve E Valdez
(74) *Attorney, Agent, or Firm* — Oliff PLC

(57) ABSTRACT

There is provided a switching element including two electrodes and an organic bistable material sandwiched between the electrodes, which is expected to be applied to an organic memory element or the like. A switching element which includes: two electrodes; and an organic thin film containing a metal fine particle and interposed between the electrodes, and which exhibits such a current bistability that the switching element has two stable resistance values in response to a voltage applied, the switching element characterized in that the metal fine particle is dispersed in the organic thin film with a metal fine particle-dispersing agent containing a polymer having a dithiocarbamate group and having a weight average molecular weight of 500 to 5,000,000.

9 Claims, 5 Drawing Sheets

ORGANIC SWITCHING ELEMENT AND METHOD FOR PRODUCING THE SAME

TECHNICAL FIELD

The present invention relates to a switching element including two electrodes and an organic bistable material sandwiched between the electrodes, which is expected to be applied to an organic memory element or the like.

BACKGROUND ART

Properties of organic electronic materials such as low cost and high flexibility have made outstanding progress as compared with those of related art semiconductor materials. In particular, organic bistable materials in which switching phenomenon is observed when voltage is applied to the materials until the voltage reaches or exceeds a certain value and current in a circuit suddenly increases, have been examined their application to high-density organic memory elements or the like.

The operating mechanism of such elements is attained by reversible switching between two resistance states. For example, Yang Yang et al. has shown a nonvolatile memory produced by forming a thin film of a high conductivity material such as aluminum, copper, silver, gold, nickel, magnesium, indium, calcium, and lithium, or by dispersing the high conductivity material as fine particles in an organic semiconductor such as aminoimidazole dicarbonitrile (AIDCN) and hydroxyquinoline aluminum (Alq), and an organic insulator such as polystyrene and PMMA. With this structure, the nonvolatile memory can achieve the bistability of a high resistance state and a low resistance state by applying voltage, and retains information even if the voltage is zero (see Patent Documents 1 and 2, and Non-patent Document 1).

In addition, Patent Document 3 discloses a switching element in which platinum or rhodium fine particles having an average particle diameter of 5 nm or less are dispersed as conductive fine particles in an organic bistable material layer having an electron donating functional group and an electron accepting functional group in one molecule thereof. With this structure, fine particles having little variation in particle diameter can be dispersed uniformly in a fine particle dispersion layer having thin film thickness, so that a switching element having stable properties can be obtained.

Patent Document 1: Japanese Translation of PCT International Application No. JP-A-2004-513513
Patent Document 2: Japanese Patent Application Publication No. JP-A-2005-101594
Patent Document 3: Japanese Patent Application Publication No. JP-A-2004-200569
Non-patent Document 1: Proceedings of the IEEE, 93, 7 (2005)

DISCLOSURE OF THE INVENTION

Problem to be Solved by the Invention

With the above switching element of a metal fine particle dispersion type, the cost used for metal fine particles is higher than the cost of materials used for organic semiconductors and organic insulators in general. Therefore, reducing the content of the metal fine particles is extremely important for reducing the cost of the element. However, even if the content of the metal fine particles decreases, the current bistability is still required. Then, the reduction of the content of the metal fine particles is considered to be achieved by increasing the dispersibility of the metal fine particles in the organic semiconductors or the organic insulators. In contrast, the arts described in Patent Documents 1 and 2 and Non-patent Document 1 do not specifically disclose a dispersing agent for the metal fine particles in the organic semiconductors or the organic insulators. In addition, the invention described in Patent Document 3 discloses that an organic bistable material having an electron donating functional group and an electron accepting functional group in one molecule thereof is employed, but discloses nothing to indicate that due to the employment, the content of the conductive fine particles can be reduced, and the element has current bistability.

Means for Solving the Problem

As a result of intensive studies made by the inventors of the present invention in order to solve the problems described above, by employing a metal fine particle-dispersing agent containing a dithiocarbamate group, the dispersibility of metal fine particles in an organic semiconductor and an organic insulator can increase. Because of this, the content of the metal fine particles can successfully decrease.

Specifically, the present invention provides: according to a first aspect, a switching element which includes: two electrodes; and an organic thin film containing a metal fine particle and interposed between the electrodes, and which exhibits such a current bistability that the switching element has two stable resistance values in response to a voltage applied, the switching element being characterized in that the metal fine particle is dispersed in the organic thin film with a metal fine particle-dispersing agent containing a polymer having a dithiocarbamate group and having a weight average molecular weight of 500 to 5,000,000;

according to a second aspect, the switching element according to the first aspect, in which the metal fine particle is at least one selected from the group consisting of scandium, titanium, vanadium, chromium, manganese, iron, cobalt, nickel, copper, zinc, gallium, germanium, yttrium, zirconium, niobium, molybdenum, ruthenium, rhodium, palladium, silver, cadmium, indium, tin, antimony, hafnium, tantalum, tungsten, rhenium, osmium, iridium, platinum, gold, mercury, thallium, and bismuth;

according to a third aspect, the switching element according to the second aspect, in which the metal fine particle is at least one selected from the group consisting of gold, silver, platinum, copper, nickel, ruthenium, rhodium, palladium, osmium, and iridium;

according to a fourth aspect, the switching element according to the third aspect, in which a metal species of the metal fine particle is at least one selected from the group consisting of gold, silver, platinum, and copper;

according to a fifth aspect, the switching element according to the first aspect, in which the metal fine particle-dispersing agent is a branched polymer of Formula (1):

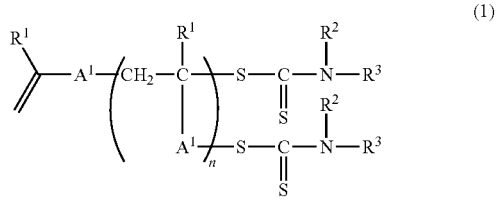

(1)

{where $R^1$ is a hydrogen atom or a methyl group; $R^2$ and $R^3$ are each a $C_{1-5}$ alkyl group, a $C_{1-5}$ hydroxyalkyl group, or a $C_{7-12}$ arylalkyl group, or $R^2$ and $R^3$ are optionally bonded to each other to form a ring together with a nitrogen atom to represent a dithiocarbamate group; $A^1$ is a group of Formula (2) or Formula (3):

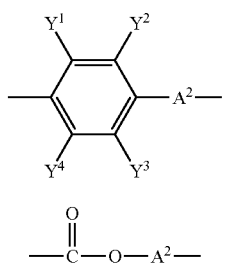

(2)

(3)

(where $A^2$ is a liner, branched, or cyclic $C_{1-30}$ alkylene group that optionally contains an ether bond or an ester bond; $Y^1, Y^2, Y^3$, and $Y^4$ are each a hydrogen atom, a $C_{1-20}$ alkyl group, a $C_{1-20}$ alkoxy group, a nitro group, a hydroxy group, an amino group, a carboxyl group, or a cyano group); and n is the number of a repeating unit structure and is an integer of 2 to 100,000};

according to a sixth aspect, the switching element according to the first aspect, in which an average particle diameter of the metal fine particle is 1 nm or more to 500 nm or less;

according to a seventh aspect, the switching element according to the first aspect, in which a matrix polymer that forms the organic thin film is polystyrene, poly(methyl methacrylate), or a hyperbranched polymer;

according to an eighth aspect, the switching element according to the seventh aspect, in which the hyperbranched polymer is a polymer of Formula (4):

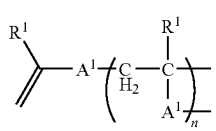

(4)

(where $R^1$ is a hydrogen atom or a methyl group; $A^1$ is a group of Formula (5) or Formula (6):

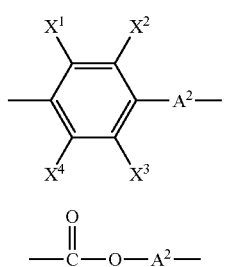

(5)

(6)

(where $A^2$ is a liner, branched, or cyclic $C_{1-30}$ alkylene group that optionally contains an ether bond or an ester bond; $X^1, X^2, X^3$, and $X^4$ are each a hydrogen atom, a $C_{1-20}$ alkyl group, a $C_{1-20}$ alkoxy group, a halogen atom, a nitro group, a hydroxy group, an amino group, a carboxyl group, or a cyano group); and n is the number of a repeating unit structure and is an integer of 2 to 100,000);

according to a ninth aspect, the switching element according to the eighth aspect, in which in the hyperbranched polymer, $A^2$ in the formulae is a group of Formula (7) or Formula (8):

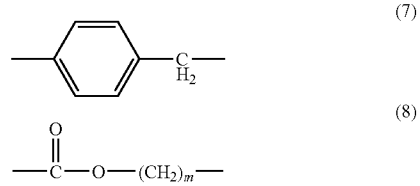

(7)

(8)

(where m is an integer of 2 to 10); and according to a tenth aspect, a method for producing the switching element as described in the first aspect, characterized by including: forming an electrode on a substrate; forming an organic thin film containing a metal fine particle on the electrode; and forming an electrode on the organic thin film.

Effects of the Invention

In an organic memory element of a fine particle dispersion type, metal fine particles that are dispersed with a polymer having a dithiocarbamate group is used instead of related art metal fine particles of an alkanethiol coated type. Because of this, the dispersibility of the metal fine particles is high, and thus, the stability of properties is high. Further, the amount of metal fine particles used can be reduced, which enables the cost reduction of the element.

For example, in order to achieve desired current bistability in an organic thin film having a film thickness of 200 nm, the concentration of gold fine particles is required to be 2% by mass or more when related art dodecanethiol dispersing agent is used. By contrast, when the metal fine particle-dispersing agent of the present invention is used, 0.2% by mass of the concentration of gold fine particles, which is about one-tenth of the above concentration, is sufficient.

BEST MODES FOR CARRYING OUT THE INVENTION

The details for carrying out the present invention will be described.

FIG. 1 is a schematic view showing an embodiment of a switching element 1 of the present invention. The switching element 1 has a structure in which a first electrode 2, an organic thin film 3, and a second electrode 4 are laminated on a substrate. The first electrode 2 and the second electrode 4 are coupled to an electronic control unit 7 via electrical connections 5 and 6, respectively. In this structure, the organic thin film 3 is formed by dispersing a metal fine particle 8 in a matrix 9.

Examples of a forming method of the first electrode and the second electrode include a vacuum deposition method, a sputtering method, a coating method, an ink jet method, a printing method, and a sol-gel method. Further, examples of the patterning method of the electrodes include a photolithography method, an ink jet method, a printing method such as a screen printing, an offset printing, and a relief printing, a microcontact printing method, an evaporation method using a shadow mask, and a method of the combination of a plurality of these methods.

In addition, the organic thin film is laminated by a method selected from an evaporation method, a spin coating method, a dipping method, and the like as appropriate.

Examples of the first electrode and the second electrode materials include: a metal such as Au, Pt, Ag, Al, Cu, Rh, Ir, In, Ni, Pd, As, Se, Te, Mo, W, Mg, and Zn; an alloy such as Mg/Cu, Mg/Ag, Mg/Al, and Mg/In, a metallic oxide such as $SnO_2$, $InO_2$, $ZnO$, $InO_2 \cdot SnO_2$ (ITO), and $Sb_2O_5 \cdot SnO_2$ (ATO); a conductive polymer such as conductive polyaniline, conductive polypyrrole, and conductive polythiophene; and carbon.

For a fine particle used for the organic thin film, a fine particle that is dispersion-stabilized with an organic compound, and has an average particle diameter of 1 to 500 nm, preferably 1 to 100 nm, and more preferably 1 to 10 nm, can be used. In addition, examples of a metal species of the metal fine particle include at least one selected from the group consisting of scandium, titanium, vanadium, chromium, manganese, iron, cobalt, nickel, copper, zinc, gallium, germanium, yttrium, zirconium, niobium, molybdenum, ruthenium, rhodium, palladium, silver, cadmium, indium, tin, antimony, hafnium, tantalum, tungsten, rhenium, osmium, iridium, platinum, gold, mercury, thallium, and bismuth; preferably at least one selected from the group consisting of gold, silver, platinum, copper, nickel, ruthenium, rhodium, palladium, osmium, and iridium; and more preferably at least one selected from the group consisting of gold, silver, platinum, and copper.

Examples of an applicable matrix of the organic thin film include a material such as polystyrene, polyesters, poly(vinyl alcohol), polycarbonate, poly(acrylic acid)s such as poly(methyl acrylate), poly(methacrylic acid)s such as poly(methyl methacrylate), polyolefins, polyamides, polyimides, polyurethanes, polyacetals, polysilicones, and polyvinylpyridines; and preferably polystyrene and poly(methyl methacrylate).

When the organic thin film is applied by the spin coating method, the dipping method, or the like, a solvent selected from: an aromatic solvent such as toluene, xylene, and dichlorobenzene; ketones such as methyl ethyl ketone and cyclohexanone; and ethers such as tetrahydrofuran, is used.

According to the present invention, a metal fine particle-dispersing agent containing a polymer having a dithiocarbamate group is used. By containing the metal fine particle-dispersing agent, a dispersed state of metal fine particles having an average particle diameter of 10 nm or less, for example about 3.5 nm, can be made.

The dispersed state caused by the metal fine particle-dispersing agent used in the present invention becomes clear by a measurement using a STEM apparatus in accordance with high angle annular dark field (HAAD). The metal fine particles are attached to the dithiocarbamate group positioned outside of the periphery of the metal fine particle-dispersing agent serving as a core. It is considered that because of this, metal nanoparticles can be dispersed, and the aggregation of the metal fine particles can be continuously prevented.

Accordingly, in the switching element of the present invention in which the organic thin film contains such a metal fine particle-dispersing agent, the metal fine particles in the organic thin film are dispersed uniformly in a nanoparticle state. By increasing the dispersibility, even when the content of the metal fine particles decreases, a stable dispersed state can be formed to enable the cost reduction of the element.

Moreover, the metal fine particle-dispersing agent having a weight average molecular weight Mw in a range of 500 to 5,000,000 determined by gel permeation chromatography as converted into polystyrene is used. When Mw is out of the range, the dispersibility of the metal fine particles is insufficient. The metal fine particle-dispersing agent has a weight average molecular weight of, preferably 1000 to 1,000,000, more preferably 2000 to 500,000, and most preferably 3000 to 200,000. In addition, a degree of dispersion Mw (weight average molecular weight)/Mn (number average molecular weight) of the metal fine particle-dispersing agent is 1.0 to 7.0, preferably 1.1 to 6.0, and more preferably 1.2 to 5.0.

The switching element can be produced by: for example, applying a solution containing a matrix and metal fine particles that is treated with a metal fine particle-dispersing agent to the upper surface of an electrode layer; annealing the solution to form an organic thin film; and depositing an electrode layer on the film.

The solution containing metal fine particles that is treated with a metal fine particle-dispersing agent can be obtained by adding a reducing agent to an aqueous solution of a metal salt to reduce metal ions. Examples of the metal salt include chloroauric acid, silver nitrate, copper sulfate, copper nitrate, platinum(II) chloride, palladium chloride, palladium acetate, palladium nitrate, rhodium chloride, rhodium acetate, ruthenium chloride, ruthenium acetate, iridium chloride, and iridium acetate. In addition, examples of a usable reducing agent include a borohydride salt of alkali metals such as sodium borohydride, a hydrazine compound, citric acid or a salt thereof, succinic acid or a salt thereof, and ascorbic acid or a salt thereof. The additive amount of the metal fine particle-dispersing agent is preferably 50 to 2,000 parts by weight based on 100 parts by weight of the metal ions. When the additive amount is less than 50 parts by weight, the dispersibility of the metal fine particles is insufficient. However, when the additive amount is more than 2,000 parts by weight, an organic substance content increases to easily cause a problem in physical properties or the like. The additive amount is preferably 100 to 1,000 parts by weight.

Moreover, fewer impurity ions such as sodium, potassium, and calcium ions contained in the metal fine particles are desired, because the repetition reproducibility of the element increases. These impurity ions can be washed and removed by: a reprecipitation method using a solvent such as water and alcohols; a method of separating metal fine particles from water by dissolving the metal fine particles into an organic solvent that is immiscible in water; a method of using an ion exchange resin; and the like.

EXAMPLES

The present invention will be described more in detail referring to Examples, which should not be construed as limiting the scope of the present invention.

Here, an abbreviation "Et" in Formulae denotes an ethyl group.

Synthetic Example 1

Synthesis of N,N-diethyldithiocarbamylmethylstyrene

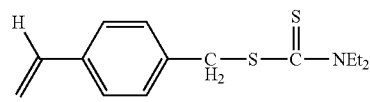

To a 2-L reaction flask, 120 g of chloromethylstyrene (trade name: CMS-14; manufactured by AGC SEIMI CHEMICAL CO., LTD.), 181 g of sodium N,N-diethyldithiocarbamate trihydrate (manufactured by KANTO CHEMICAL CO., INC.), and 1,400 g of acetone were charged, and the resultant mixture was reacted with stirring at a temperature of 40° C. for 1 hour. After the reaction, the precipitated sodium chloride was removed by filtering, and then acetone was distilled off from the resultant reaction mixture by an evaporator to produce a reaction coarse powder. The reaction coarse powder was redissolved in toluene to be separated in toluene/water system, and then the objective substance was recrystallized from the toluene phase in a freezer of minus 20° C. The crystalline substance was filtered and vacuum dried to produce 206 g of the objective substance as a white powder (yield of 97%). The purity (relative area percentage) determined by liquid chromatography was 100%. In addition, the melting point determined by DSC was 56° C.

Synthetic Example 2

Synthesis of Styrene-Based Hyperbranched Polymer Having Dithiocarbamate Group at Molecular End Thereof (HPS)

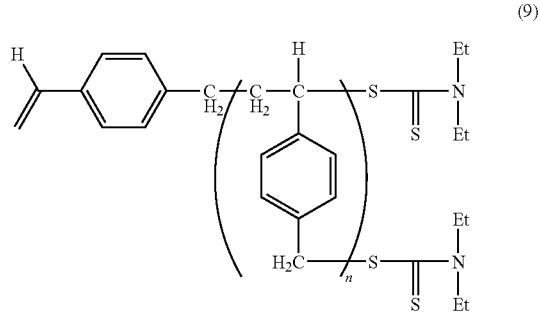

(9)

To a 300-mL reaction flask, 108 g of N,N-diethyldithiocarbamylmethylstyrene obtained in Synthetic Example 1 and 72 g of toluene were charged, and the resultant mixture was stirred to prepare a light yellow transparent solution. Subsequently, the inside of the reaction system was substituted with nitrogen. A 100 W high-pressure mercury-vapor lamp (HL-100; manufactured by SEN LIGHTS Co., Ltd.) was lighted up from the center of this solution, and a photo polymerization reaction was effected by internal irradiation with stirring at a temperature of 30° C. for 12 hours. Subsequently, the resultant reaction liquid was added to 3,000 g of methanol to reprecipitate a polymer with high viscosity in a massive form, and then supernatant fluid was removed by decantation. Further, this polymer was redissolved in 300 g of tetrahydrofuran, and then the resultant solution was added to 3,000 g of methanol to reprecipitate a polymer in a slurry state. This slurry was filtered and vacuum dried to produce 48 g of the objective substance (HPS) as a white powder. The weight average molecular weight Mw determined by gel permeation chromatography as converted into polystyrene was 20,000, and the degree of dispersion Mw/Mn was 3.5.

Synthetic Example 3

Synthesis of HPS—Au 0.5 g of HPS obtained in Synthetic Example 2 was dissolved in 200 ml of THF, and to the resultant mixture, 6.7 mL of 30 mM chloroauric acid aqueous solution was added. Subsequently, 10 mL of 0.1 M sodium borohydride aqueous solution was dropped over about 5 minutes. The color of the resultant solution varied to brown in accordance with the drop. The resultant mixture was stirred for 30 minutes, thereafter THF was distilled off under reduced pressure, and then a black precipitation insoluble in water was precipitated. The precipitation was filtered and washed with ion exchanged water, and then to the washed precipitation, 20 mL of THF was added to be dissolved, and the resultant solution was reprecipitated with methanol. The obtained powder was recovered and dried. The UV spectrum of a THF solution of the obtained gold fine particles (HPS—Au) is shown in FIG. 2. In addition, the content of sodium and gold in the composition was determined by an inductive coupling plasma atomic emission spectroscopy analyzer (ICP-AES), and found to be 150 ppm and 6.4 wt %, respectively. Moreover, the content of chlorine was determined by ion chromatography (ICS-500; manufactured by Dionex Corporation), and found to be 63 ppm.

As shown in the result of FIG. 2, the surface plasmon absorption of gold nanoparticles was observed around about 520 nm. Thus, the actual generation of gold fine particles (HPS—Au) was confirmed.

Synthetic Example 4

Purification of HPS—Au 2 g of HPS—Au obtained in Synthetic Example 3 was dissolved in 20 mL of THF, and the resultant solution was dropped into a mixed solvent of 40 g of water and 60 g of methanol to be reprecipitated. The resultant powder was recovered and dried. With the obtained purified gold fine particles (HPS—Au), the content of sodium and gold in the composition was determined by an inductive coupling plasma atomic emission spectroscopy analyzer (ICP-AES), and found to be 38 ppm and 8.1 wt %, respectively. In addition, the content of chlorine was determined by ion chromatography, and found to be 34 ppm.

Synthetic Example 5

Synthesis of HPS—H (Reduction and Removal of Dithiocarbamate Group

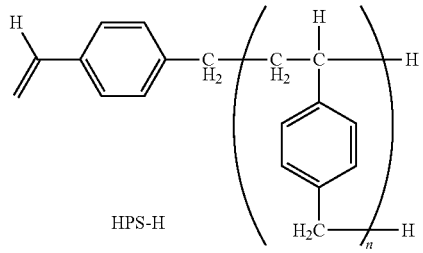

HPS-H

To a 300-mL reaction flask, 14 g of a hyperbranched polymer having a dithiocarbamate group at a molecular end thereof (HPS) obtained in Synthetic Example 2, 28 g of tributyltin hydride (manufactured by Sigma-Aldrich Corporation), and 140 g of toluene were charged. The resultant mixture was stirred to prepare a colorless transparent solution, and then the inside of the reaction system was substituted with nitrogen. A 100 W high-pressure mercury-vapor lamp (HL-100; manufactured by SEN LIGHTS Co., Ltd.) was lighted up from the center of this solution, and a reaction was effected by internal irradiation with stirring at room temperature for 15 minutes. Subsequently, to the resultant reaction liquid, 500 g of toluene was added to be diluted, and the diluted liquid was added to 3,600 g of methanol to reprecipitate a hyperbranched polymer in a slurry state. The slurry was filtered and vacuum dried to produce 5.3 g of a hyperbranched polymer in which a dithiocarbamate group is substituted with hydrogen (HPS—H) as a white powder. The weight average molecular weight Mw determined by gel permeation chromatography as converted into polystyrene was 33,000, and the degree of dispersion Mw/Mn was 4.26.

Synthetic Example 6

Synthesis of N,N-Diethyldithiocarbamylethyl Methacrylate

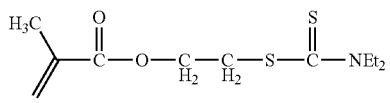

To a 2-L reaction flask, 100 g of chloroethyl methacrylate (manufactured by Lancaster Synthesis Ltd.), 178 g of sodium N,N-diethyldithiocarbamate trihydrate (manufactured by KANTO CHEMICAL CO., INC.), and 1,100 g of acetone were charged, and the resultant mixture was reacted with stirring at a temperature of 40° C. for 14 hours. After the reaction, the precipitated sodium chloride was removed by filtering, and then acetone was distilled off from the resultant reaction solution by an evaporator to produce a reaction coarse powder. The reaction coarse powder was redissolved in 1,2-dichloroethane to be separated in 1,2-dichloroethane/water system, and then 1,2-dichloroethane was distilled off from the 1,2-dichloroethane phase to produce 171 g of the objective substance (yield of 97%) as a yellow liquid. The purity (relative area percentage) determined by liquid chromatography was 96%.

Synthetic Example 7

Synthesis of Acryl-Based Hyperbranched Polymer Having Dithiocarbamate Group at Molecular End Thereof (HPEMA)

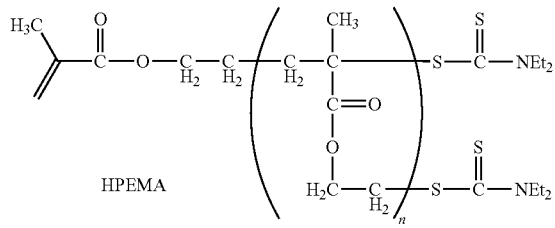

To a 300-mL reaction flask, 90 g of N,N-diethyldithiocarbamylethyl methacrylate obtained in Synthetic Example 6 and 90 g of toluene were charged, and the resultant mixture was stirred to prepare a light yellow transparent solution. Subsequently, the inside of the reaction system was substituted with nitrogen. A 100 W high-pressure mercury-vapor lamp (HL-100; manufactured by SEN LIGHTS Co., Ltd.) was lighted up from the center of this solution, and a photo polymerization reaction was effected by internal irradiation with stirring at room temperature for 5 hours. Subsequently, the resultant reaction liquid was added to 3,000 g of methanol to reprecipitate a polymer with high viscosity in a massive form, and then supernatant fluid was removed by decantation. Further, this polymer was redissolved in 400 g of tetrahydrofuran, and then the resultant solution was added to 5,000 g of methanol to reprecipitate a polymer in a slurry state. This slurry was filtered and vacuum dried to produce 44 g of the objective substance (HPEMA) as a white powder. The weight average molecular weight Mw determined by gel permeation chromatography as converted into polystyrene was 31,000, and the degree of dispersion Mw/Mn was 2.66.

Synthetic Example 8

Synthesis of HPEMA-H(Reduction and Removal of Dithiocarbamate Group

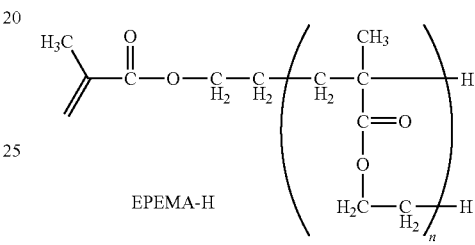

To a 300-mL reaction flask, 15 g of a hyperbranched polymer having a dithiocarbamate group at a molecular end thereof (HPEMA) obtained in Synthetic Example 7, 30 g of tributyltin hydride (manufactured by Sigma-Aldrich Corporation), and 135 g of tetrahydrofuran were charged. The resultant mixture was stirred to prepare a light yellow transparent solution, and then the inside of the reaction system was substituted with nitrogen. A 100 W high-pressure mercury-vapor lamp (HL-100; manufactured by SEN LIGHTS Co., Ltd.) was lighted up from the center of this solution, and a reaction was effected by internal irradiation with stirring at room temperature for 1 hour. Subsequently, the resultant reaction liquid was added to 2,000 g of hexane to reprecipitate a hyperbranched polymer in a slurry state. The slurry was filtered and vacuum dried to produce 5.7 g of the objective substance (HPEMA-H) as a white powder. The weight average molecular weight Mw determined by gel permeation chromatography as converted into polystyrene was 25,000, and the degree of dispersion Mw/Mn was 1.81.

Synthetic Example 9

Synthesis of HPS—Pt 132 mg (0.2 mmol) of Pt(DBA)$_2$ (DBA: dibenzylideneacetone) was charged into a 20-mL reaction Schlenk tube, and the inside of the tube was substituted with nitrogen. To the tube, 5 mL of THF was added and stirred for a few minutes. 26.5 mg (0.1 mmol) of HPS obtained in Synthetic Example 2 was charged into a 20-mL 2-neck flask, and the inside of the flask was substituted with nitrogen. Subsequently, 5 mL of THF was added to the flask, and the resulting solution was added dropwise to the Schlenk tube. The inside of the system was substituted with hydrogen and was stirred at room temperature for 16 hours. The resultant reaction solution was purified by reprecipitation using methanol, filtered, and dried under reduced pressure to produce 35 mg of black precipitation. The particle diameter of HPS—Pt observed by a scanning electron microscope (TEM; JTEM2100F; manufactured by JEOL Ltd.) was 2 nm.

Example 1

A switching element as shown in FIG. 1 was produced. First, aluminum (Al) was vacuum-deposited on the upper surface of a glass substrate that was washed in advance to form an Al electrode layer 2 having a thickness of 80 nm. Next, an organic thin film 3 containing a hyperbranched polymer (HPS) shown in Formula (9) as a matrix and gold fine particles (HPS—Au) obtained in Synthetic Example 3 as metal fine particles was formed. The organic thin film 3 was produced by: dissolving HPS, HPS—Au, and 8-hydroxyquinoline (8HQ) in o-dichlorobenzene to prepare a solution so as to have a weight ratio of 60:20:20; spincoating this solution on the upper surface of the Al electrode layer 2; and annealing the coated solution at 150° C. for 30 minutes. The film thickness of the organic thin film 3 was 200 nm. An Al electrode layer 4 was deposited on the upper surface of the organic thin film 3. The film thickness of the Al electrode layer 4 was 80 nm. The Al electrodes 2 and 4 positioned at the upper and the lower surfaces of the organic thin film 3 were deposited under vacuum of about $1\times10^{-6}$ Torr with the film thickness being observed with a quartz oscillator film thickness meter.

The J-V characteristic of this element is shown in FIG. 3. The voltage scan used was 0.15 V/step. A lower curve 21 (solid line) shows sweep in which current density was measured while increasing a voltage from 0 V, and an upper curve 22 (dashed line) shows sweep in which current density was measured while decreasing a voltage to 0 V.

Although the element exhibited, at first, a conductivity of $10^{-14}$ to $10^{-13}$ (1/Ω·cm) in a voltage region of 0.1 to 3.0 V at the time of sweep when the voltage increased, the conductivity abruptly increased when the bias voltage reached 3.5 V. Subsequently, the element exhibited a conductivity of $10^{-8}$ (1/Ω·cm) in the same voltage region of 0.1 to 3.0 V at the time of sweep when the voltage decreased, which exhibits current bistability. The element continuously maintained the stable state of each of a high conductive state and a low conductive state when the sweeping of a voltage was up to 3.5 V. However, by sweeping to increase the voltage to 6 V or more, the state was able to be switched to a low conductive state, and by sweeping to decrease the voltage from 6 V or more, the state was able to be returned to a high conductive state.

In addition, for a method for switching the two stable states, by simply applying a voltage of 6 V or more, the state was able to be switched to a low conductive state, and by applying four different voltages from 4.5 V to 3.0 V by 0.5-V steps, the state was able to be switched to a high conductive state.

Example 2

A number of switching elements were produced in accordance with Example 1 except that the thickness of the organic thin film 3 in FIG. 1 was varied from 90 nm to 700 nm. The elements having the organic thin film 3 with a thickness of 360 nm or less exhibited current bistability that can reversibly switch between a high conductive state and a low conductive state. A graph showing relationship between a film thickness and a threshold voltage when conductivity abruptly increased is shown in FIG. 4.

Example 3

A number of elements were produced in accordance with Example 1 except that the mixture ratio of HPS and HP S—Au contained in the organic thin film 3 in FIG. 1 was varied. In the mixed layer, the content of 8HQ was fixed at 20% by weight, and the weight ratio of HPS and HPS—Au was varied from 10:70 to 79.8:0.2. Based on Synthetic Example 3, this ratio is equivalent to a gold content of 4.5% by weight to 0.013% by weight in a composition ratio of the organic thin film. Among these elements, the element having a weight ratio of gold fine particles of 2% by weight or more exhibited reversible current bistability. The J-V characteristic of the element having a gold content of 0.13% by weight is shown in FIG. 5.

Example 4

An element was produced in a similar manner as that of Example 1, except that platinum fine particles (HPS—Pt) obtained in Synthetic Example 9 were used as the metal fine particles. The J-V characteristic of this element is shown in FIG. 9.

Comparative Example 1

In accordance with a two-phase cluster synthesis method (M. Brust, et. al., Chem. Comm. 7, 801 (1994)), gold fine particles (C12SH—Au) that were protected with dodecanethiol were produced. With these gold fine particles, the gold content in the composition was determined by an inductive coupling plasma atomic emission spectroscopy analyzer (ICP-AES), and found to be 67 wt %.

Comparative Example 2

An element was produced in a similar manner as that of Example 1, except that polystyrene (PS) was used as the matrix, and gold fine particles (C12SH—Au) obtained in Comparative Example 1 were used as the metal fine particles. Moreover, elements that have different contents of C12SH—Au were produced in accordance with Example 3. The content of 8HQ in the organic thin film was fixed at 20% by weight, and the weight ratio of PS and C12SH—Au was varied from 60:20 to 79.8:0.2 to produce devices. Based on Comparative Example 1, this ratio is equivalent to a gold content of 13% by weight to 0.13% by weight in a composition ratio of the organic thin film. Among these elements, the element having a gold content of 1.3% by weight or more exhibited reversal current bistability. A graph of the J-V characteristic of the element having a gold content of 1.3% by weight is shown in FIG. 6.

Although for the device in which PS and C12SH—Au were used, 1.3% by weight or more of gold in a composition ratio of the PS mixed layer was required, the device in which HPS and HPS—Au were used worked even if the gold content in a composition ratio of the HPS mixed layer was 0.13% by weight. This reveals that by using metal fine particles dispersed with a polymer having a dithiocarbamate group, the amount of the metal fine particles to be used can decrease.

Test Example

In the production of elements in accordance with Example 1, an element in which unpurified HPS—Au obtained in Synthesis Example 3 was used and an element in which purified HPS—Au obtained in Synthesis Example 4 was used, were produced. In accordance with Example 1, the current density at 1.8 V when a high conductive state and a low conductive state were repeatedly switched 20 times was measured. Twenty or more of each of the elements were produced. The measurement results of the current density range of each of the high conductive state and the low conductive state are shown in FIG. 7 and FIG. 8. In both of the high conductive state and the low conductive state, the variation of the measurement values of the element in which purified HPS—Au was used was small. This reveals that by using purified HPS—Au, the repetition reproducibility increases, and fuzziness when stored information is read out decreases.

DESCRIPTION OF THE REFERENCE NUMERALS

Figure 1:
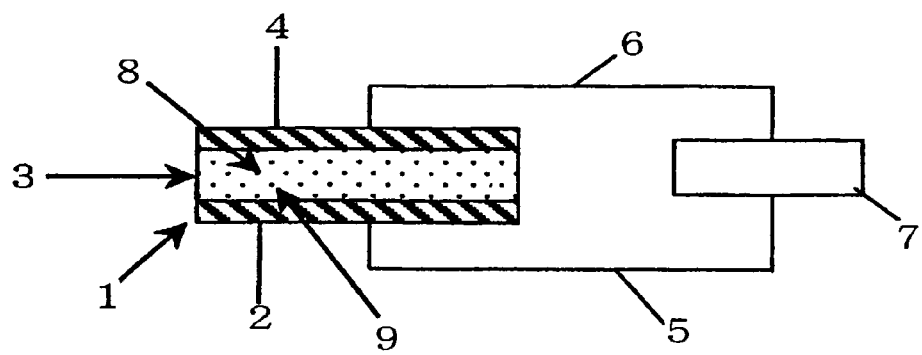
FIG. 1 is a schematic view showing an embodiment of a switching element of the present invention.
Figure 2:
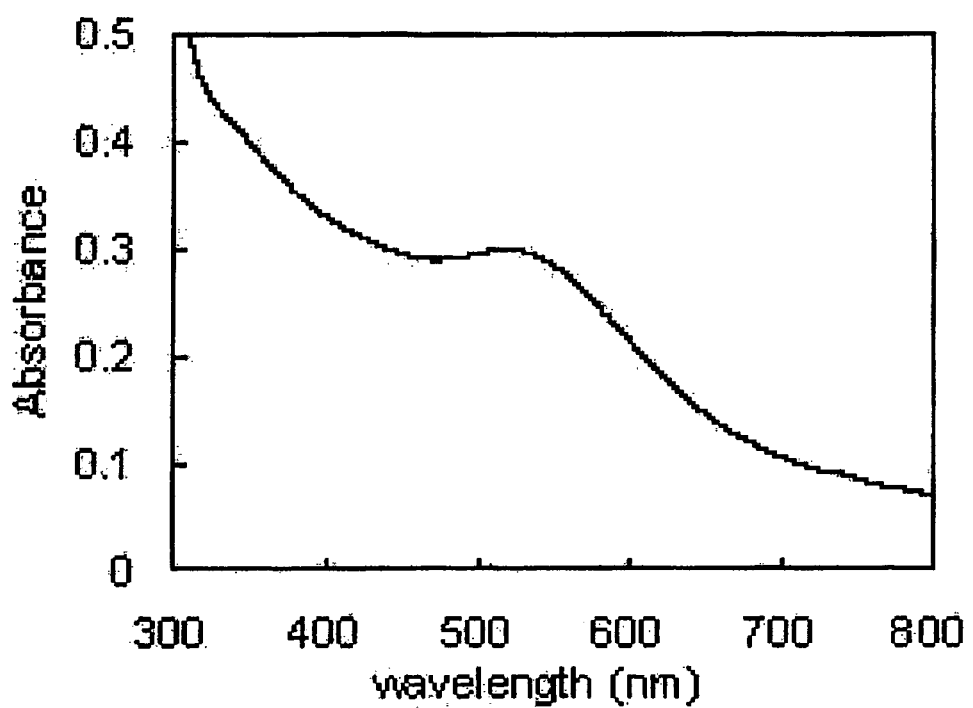
FIG. 2 is a UV spectrum of gold fine particles obtained in Synthesis Example 3.
Figure 3:
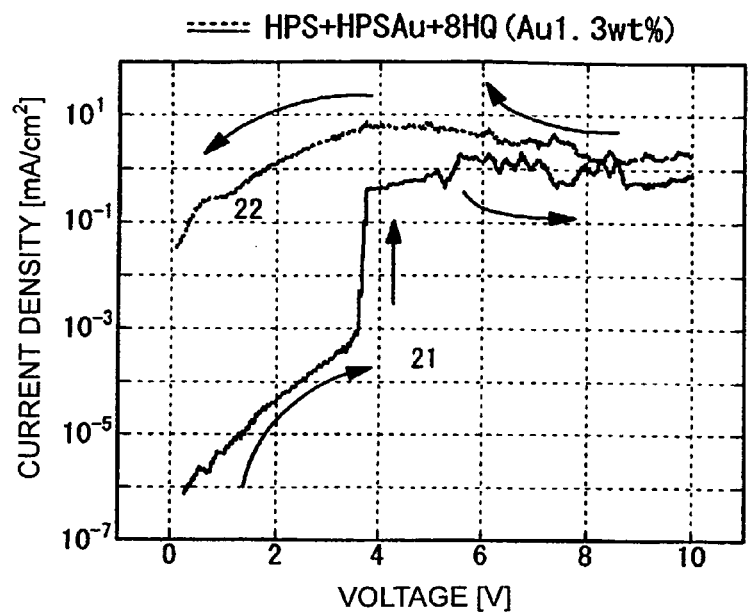
FIG. 3 is a graph of the current density vs voltage (J-V) characteristic of a switching element described in Example 1. In the graph, a curve 21 is a curve in which a bias voltage increases from 0 V, and a curve 22 is a curve in which a voltage decreases to 0 V.
Figure 4:
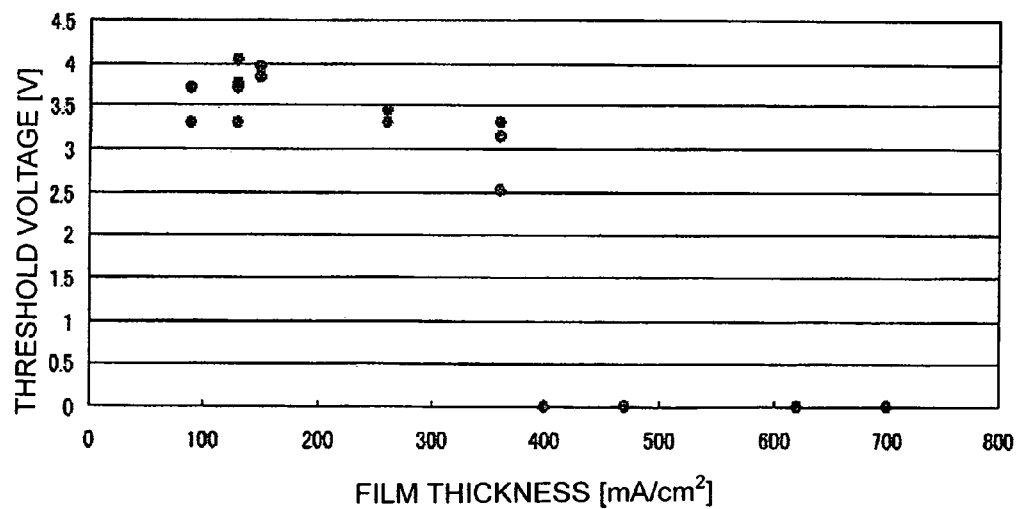
FIG. 4 is a graph showing relationship between a film thickness and a threshold voltage when conductivity abruptly increases.
Figure 5:
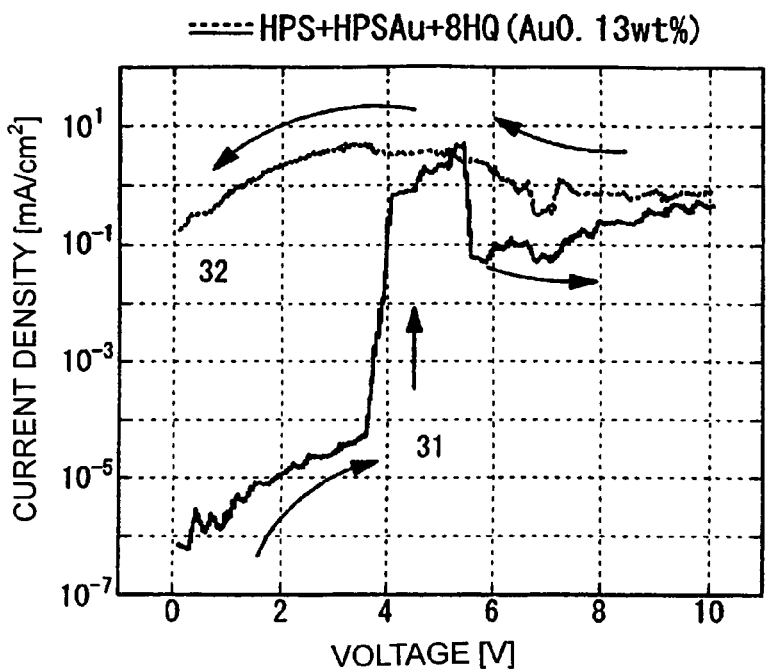
FIG. 5 is a graph of the current density vs voltage (J-V) characteristic of a switching element described in Example 3. In the graph, a curve 31 is a curve in which a bias voltage increases from 0 V, and a curve 32 is a curve in which a voltage decreases to 0 V.
Figure 6:
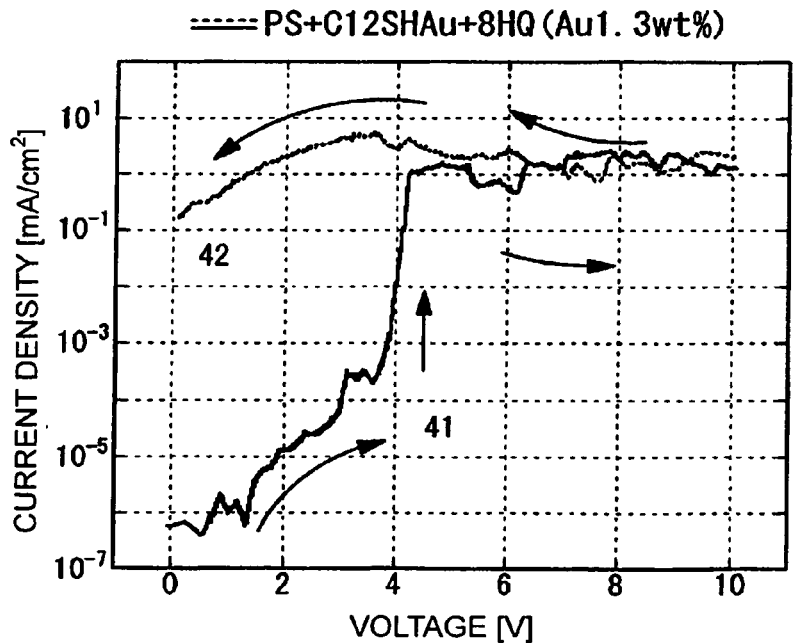
FIG. 6 is a graph of the current density vs voltage (J-V) characteristic of a switching element described in Comparative Example 2. In the graph, a curve 41 is a curve in which a bias voltage increases from 0 V, and a curve 42 is a curve in which a voltage decreases to 0 V.
Figure 7:
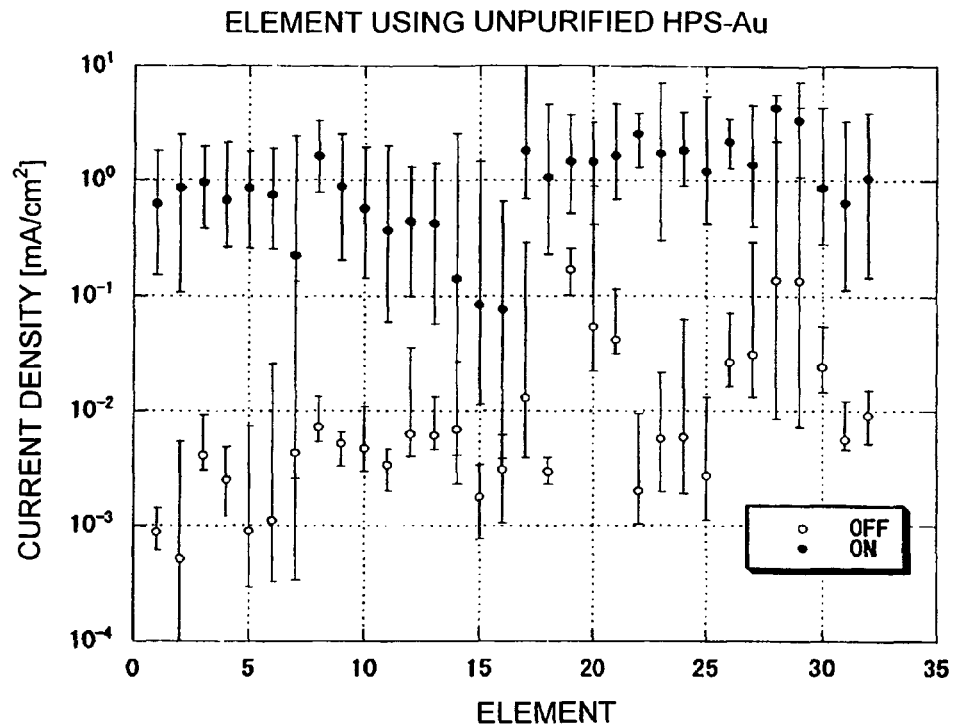
FIG. 7 is a graph showing a measured current density range when a switching element in which unpurified HPS—Au described in Test Example is used is switched 20 times. In the graph, black circles and white circles represent average current density values of a high conductive state and a low conductive state, respectively, and a pair of the circles corresponds to one element. An error bar indicates a current density range observed from the 20 measurements.
Figure 8:
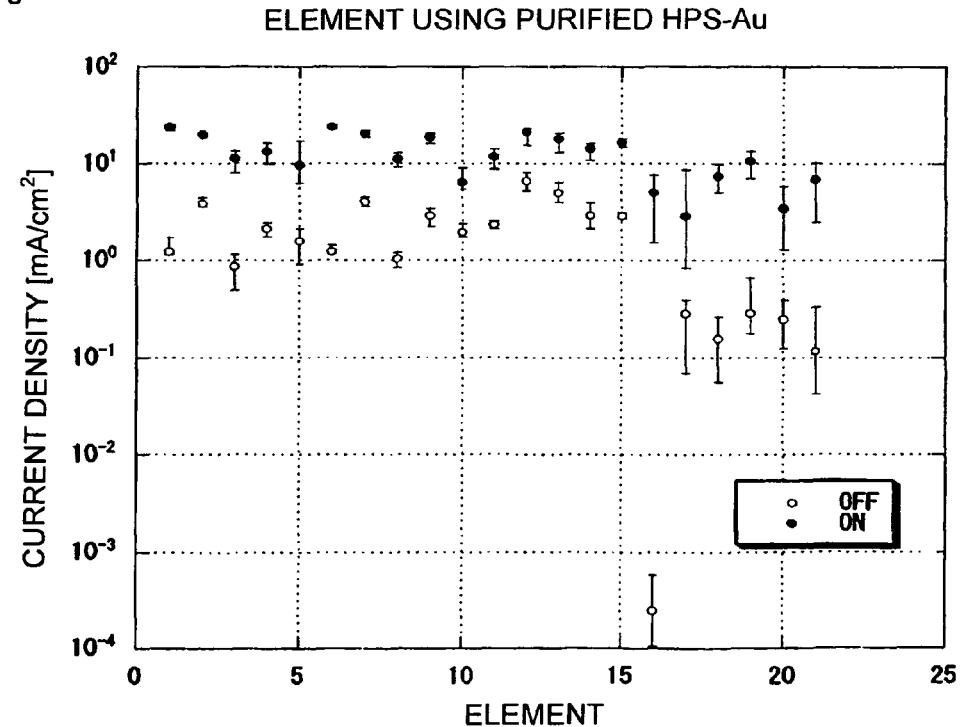
FIG. 8 is a graph showing a measured current density range when a switching element in which purified HPS—Au described in Test Example is used is switched 20 times. In the graph, black circles and white circles represent the same meanings as the description in FIG. 7.
Figure 9:
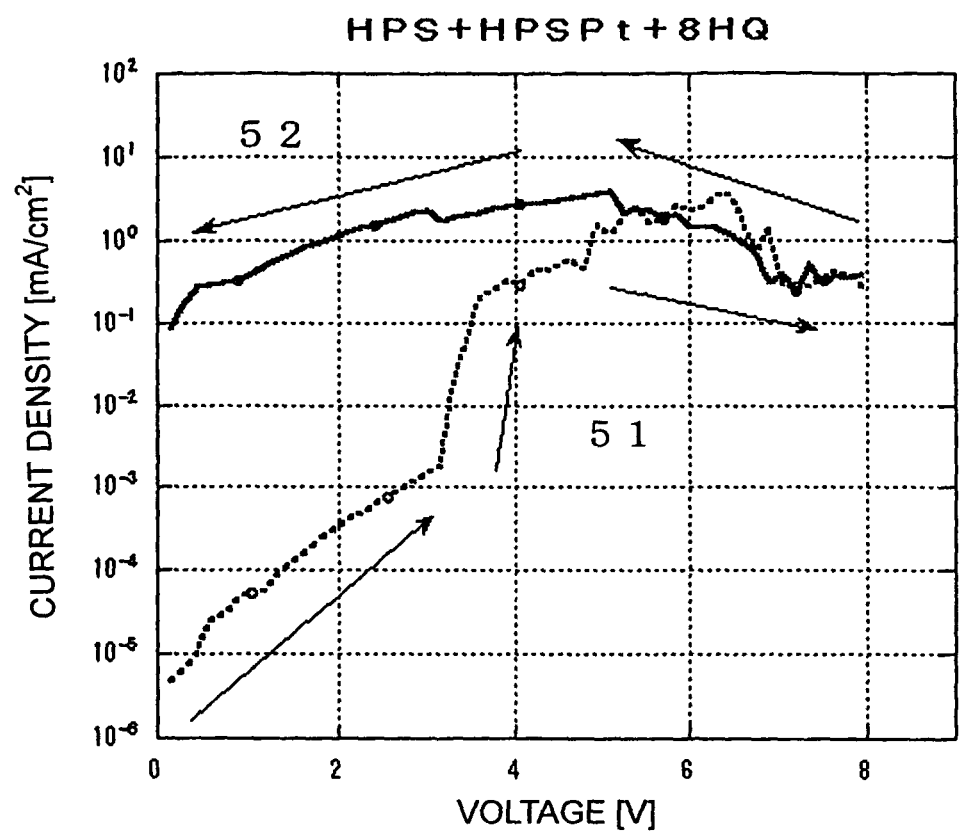
FIG. 9 is a graph of the current density vs voltage (J-V) characteristic of a switching element described in Example 4. A curve 51 is a curve in which a bias voltage increases from 0 V, and a curve 52 is a curve in which a voltage decreases to 0V.

1 SWITCHING ELEMENT
2 FIRST ELECTRODE
3 ORGANIC THIN FILM
4 SECOND ELECTRODE
5, 6 ELECTRICAL CONNECTION
7 ELECTRONIC CONTROL UNIT
8 METAL FINE PARTICLE
9 MATRIX

The invention claimed is:
1. A switching element, comprising:
two electrodes; and
an organic thin film containing a metal fine particle, wherein
the organic thin film is interposed between the electrodes,
the organic thin film exhibits such a current bistability that the switching element has two stable resistance values in response to a voltage applied, and
the metal fine particle is dispersed in the organic thin film with a metal fine particle-dispersing agent containing a polymer having a dithiocarbamate group and having a weight average molecular weight of 500 to 5,000,000, the metal fine particle-dispersing agent being a branched polymer of Formula (1):

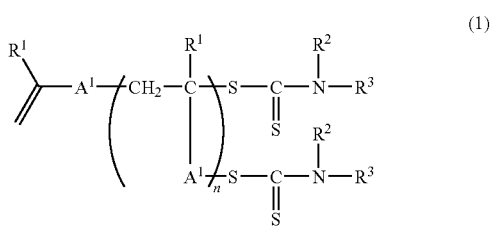

where $R^1$ is a hydrogen atom or a methyl group; $R^2$ and $R^3$ are each a $C_{1-5}$ alkyl group, a $C_{1-5}$ hydroxyalkyl group, or a $C_{7-12}$ arylalkyl group, or $R^2$ and $R^3$ are optionally bonded to each other to form a ring together with a nitrogen atom to represent a dithiocarbamate group; n is the number of a repeating unit structure and is an integer of 2 to 100,000; and $A^1$ is a group of Formula (2) or Formula (3):

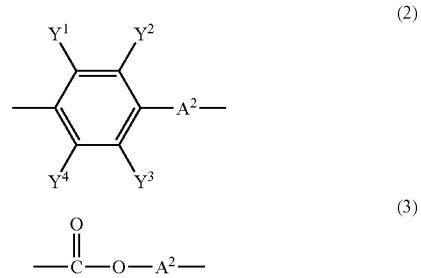

where $A^2$ is a liner, branched, or cyclic $C_{1-30}$ alkylene group that optionally contains an ether bond or an ester bond; $Y^1$, $Y^2$, $Y^3$, and $Y^4$ are each a hydrogen atom, a $C_{1-20}$ alkyl group, a $C_{1-20}$ alkoxy group, a nitro group, a hydroxy group, an amino group, a carboxyl group, or a cyano group.

2. The switching element according to claim 1, wherein the metal fine particle is at least one selected from the group consisting of scandium, titanium, vanadium, chromium, manganese, iron, cobalt, nickel, copper, zinc, gallium, germanium, yttrium, zirconium, niobium, molybdenum, ruthenium, rhodium, palladium, silver, cadmium, indium, tin, antimony, hafnium, tantalum, tungsten, rhenium, osmium, iridium, platinum, gold, mercury, thallium, and bismuth.

3. The switching element according to claim 2, wherein the metal fine particle is at least one selected from the group consisting of gold, silver, platinum, copper, nickel, ruthenium, rhodium, palladium, osmium, and iridium.

4. The switching element according to claim 3, wherein a metal species of the metal fine particle is at least one selected from the group consisting of gold, silver, platinum, and copper.

5. The switching element according to claim 1, wherein an average particle diameter of the metal fine particle is 1 nm or more and 500 nm or less.

6. The switching element according to claim 1, wherein a matrix polymer that forms the organic thin film is polystyrene, poly(methyl methacrylate), or a hyperbranched polymer.

7. The switching element according to claim 6, wherein the hyperbranched polymer is a polymer of Formula (4):

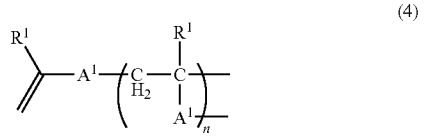

(4)

where $R^1$ is a hydrogen atom or a methyl group; n is the number of a repeating unit structure and is an integer of 2 to 100,000; and $A^1$ is a group of Formula (5) or Formula (6):

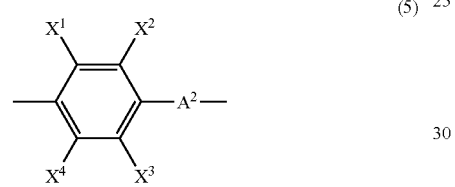

(5)

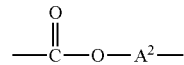

(6)

where $A^2$ is a liner, branched, or cyclic $C_{1-30}$ alkylene group that optionally contains an ether bond or an ester bond; $X^1$, $X^2$, $X^3$, and $X^4$ are each a hydrogen atom, a $C_{1-20}$ alkyl group, a $C_{1-20}$ alkoxy group, a halogen atom, a nitro group, a hydroxy group, an amino group, a carboxyl group, or a cyano group.

8. The switching element according to claim 7, wherein in the hyperbranched polymer, $A^2$ in the formulae is a group of Formula (7) or Formula (8):

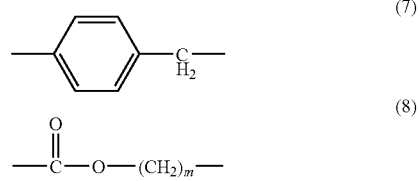

(7)

(8)

where m is an integer of 2 to 10.

9. A method for producing the switching element as claimed in claim 1, comprising:
    forming an electrode on a substrate;
    forming an organic thin film containing a metal fine particle on the electrode; and
    forming an electrode on the organic thin film.

\* \* \* \* \*